United States Patent [19]

Hwang

[11] Patent Number: 5,557,855
[45] Date of Patent: Sep. 24, 1996

[54] RETICLE

[75] Inventor: Joon Hwang, Chungcheongbuk-do, Rep. of Korea

[73] Assignee: Hyundai Electronics Industries Co., Ltd., Kyungiki-do, Rep. of Korea

[21] Appl. No.: 408,277

[22] Filed: Mar. 22, 1995

[30] Foreign Application Priority Data

Mar. 22, 1994 [KR] Rep. of Korea .................. 94-5692
Mar. 22, 1994 [KR] Rep. of Korea .................. 94-5693

[51] Int. Cl.$^6$ .................. G01B 21/00; G01B 5/00
[52] U.S. Cl. .................. 33/613; 33/286; 33/533
[58] Field of Search .................. 33/297, 298, 286, 33/533, 645, 613, 614, 615, 623, 1 M

[56] References Cited

U.S. PATENT DOCUMENTS

| | | | |
|---|---|---|---|
| 4,520,570 | 6/1985 | Bednorz et al. | 33/613 |
| 4,635,373 | 1/1987 | Miyazaki et al. | 33/533 |
| 4,934,064 | 6/1990 | Yamaguchi et al. | 33/613 |

FOREIGN PATENT DOCUMENTS

| | | | |
|---|---|---|---|
| 82009 | 6/1980 | Japan | 33/645 |
| 62-115165 | 5/1987 | Japan . | |
| 91509 | 3/1990 | Japan | 33/1 M |

*Primary Examiner*—Christopher W. Fulton
*Attorney, Agent, or Firm*—Fish & Richardson P.C.

[57] ABSTRACT

A reticle which can detect precisely an error in reticle rotation. A first main vernier is formed at an outer side of the right end of the unit field and a sub vernier is formed at the left end. A second main vernier is formed at the outer side of the upper end of the unit field, and a sub vernier is formed at the lower end. Another reticle uses a first main vernier on the right scribe lane zone, and a sub vernier on the left. A second vernier is formed on the upper side, with its sub on the lower side. These verniers are used together to determine an error.

10 Claims, 3 Drawing Sheets

14A (14B)

16  17  11

15A (15B)

18  19

22  24  23

RETICLE

BACKGROUND OF THE INVENTION

1. Field of the Invention

The present invention relates to a reticle used for a photo lithography process, more particularly to a reticle which can detect precisely a reticle rotation error.

2. Information Disclosure Statement

In general, a stepper is used for a photo lithography process. A reticle 10, as shown in FIG. 1, mounted in the stepper has a quartz substrate 1, scribe lane zone 2 and a plurality of pattern areas 3. The reticle 10 is moved to a direction of X or Y in FIG. 1 by operation of the stepper. When the reticle 10 and the wafer are loaded in the stepper, an exposure process for the wafer is performed. Here, a unit stepping distance to direction of X is X1 and, a unit stepping distance to direction Y is Y1. The reticle 10 must be aligned to confront with a product die of the wafer. However, when the reticle 10 is moved to direction of X or Y, a reticle rotation error may occur. The ordinary reticle 10 shown in FIG. 1 can not detect the reticle rotation error.

SUMMARY OF THE INVENTION

It is an object of the present invention to solve the problem with the use of the ordinary reticle.

It is another object of the present invention to provide a reticle which can detect precisely a reticle rotation error.

In nutshell, a reticle according to an embodiment of the present invention comprises a first main vernier formed at outer side of right end of the unit field, a first sub vernier formed at outer side of left end of the unit field, a second main vernier formed at outer side of upper end of the unit field, a second sub vernier formed at outer side of lower end of the unit field.

A reticle according to another embodiment of the present invention comprises a first main vernier formed on right scribe lane zone, a first sub vernier formed on left scribe lane zone, a second main vernier formed on upper scribe lane zone, a second sub vernier formed on lower scribe lane zone.

BRIEF DESCRIPTION OF THE DRAWINGS

For fuller understanding of the nature and objects of the present invention, reference should be had to the following detailed description taken in conjunction with the accompanying drawings in which.

The same reference characters refer to the same parts throughout the several view of the drawings.

DETAILED DESCRIPTION OF THE INVENTION

Figure 2:
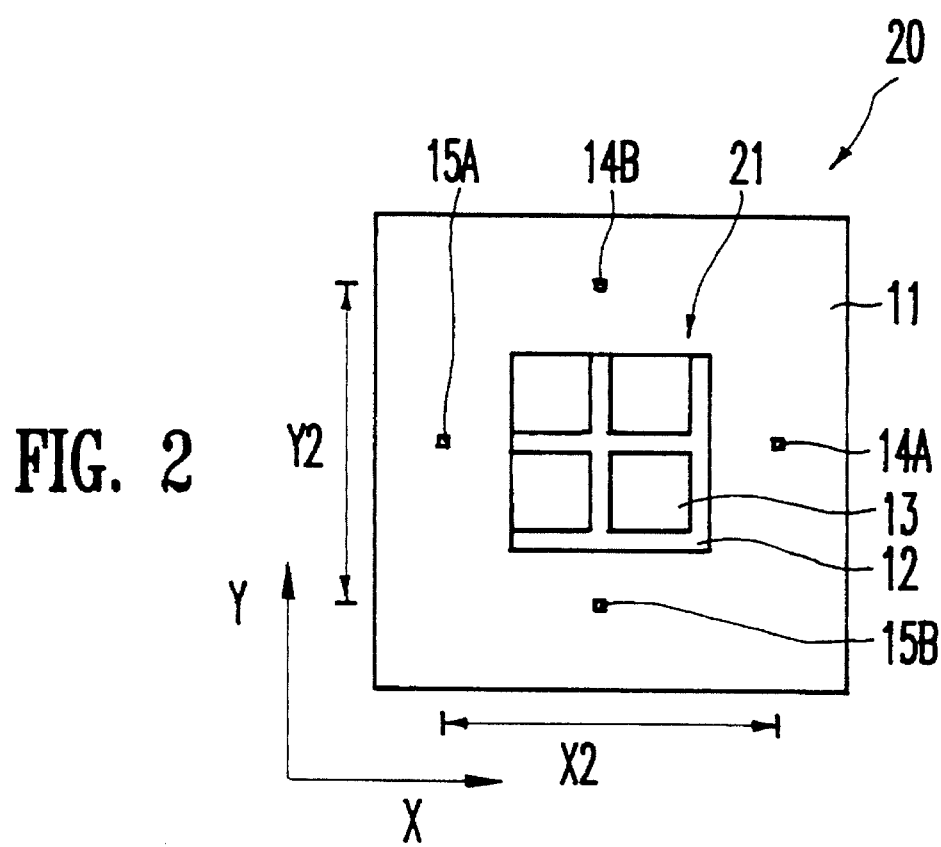
FIG. 2 is a plane view a reticle according to the first embodiment of the present invention.

Referring to FIG. 2, a reticle 20 according to the first embodiment of the present invention has a unit field 21, a pair of main verniers 14A, 14B, and a pair of sub verniers 15A, 15B. The unit field 21 comprising a scribe lane zone 12 and a plurality of pattern areas 13 is formed on a quartz substrate 11. The first main vernier 14A is formed at outer side of right end of the unit field 21 and, the first sub vernier 15A is formed at outer side of left end of the unit field 21. The second main vernier 14B is formed at outer side of upper end of the unit field 21 and, the second sub vernier 15B is formed at outer side of lower end of the unit field 21. Each vernier can be formed with chromium by a printing process.

The first main vernier 14A and the first sub vernier 15A are formed on an horizontal axis passed through a center of the unit field 21 while, the second main vernier 14B and the second sub vernier 15B are formed on a vertical axis passed through a center of the unit field 21.

Meanwhile, in order to use of overlapping of the main vernier and the sub vernier, a unit stepping distance to direction of X of a stepper is set up with a distance X2 between the first main vernier 14A and the first sub vernier 15A, a unit stepping distance to direction of Y of the stepper is set up with a distance Y2 between the second main vernier 14B and the second sub vernier 15B.

Figure 3A:
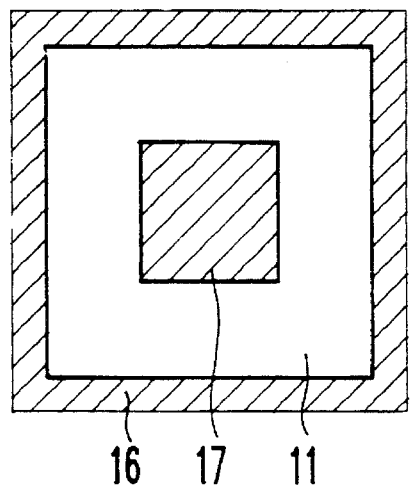
FIG. 3A is a magnified plane view of a main vernier of FIG. 2.

Referring to FIG. 3A, each of the first and second main verniers 14A and 14B comprise a first light shading zone 16 having a square loop shape and a second light shading zone 17 which has a square shape and formed at central portion of the first light shading zone 16. A length of a inner side space of the first light shading zone 16 is, for example, about 20 μm and a length of a side of the second light shading zone 17 is, for example, about 12.5 μm.

Figure 3B:
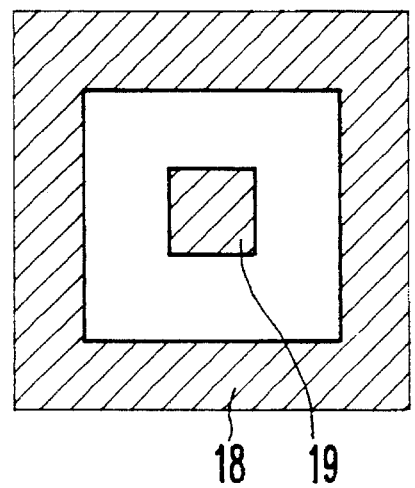
FIG. 3B is a magnified plane view of a sub vernier of FIG. 2.

Each of the first and second sub verniers 15A and 15B as shown in FIG. 3B is formed in the same shape with a shape of the main vernier 14A or 14B except a size. That is, a length of a inner side space of the first light shading zone 18 having a square loop shape of the sub vernier 15A or 15B is less than that of the first light shading zone 16 of the main vernier 14A or 14B, for example about 17.5 μm and a length of a side of the second light shading zone 19 having a square shape of the sub vernier 15A or 15B is less than that of the second light shading zone 17 of the main vernier 14A or 14B, for example about 10.5 μm.

Figure 3C:
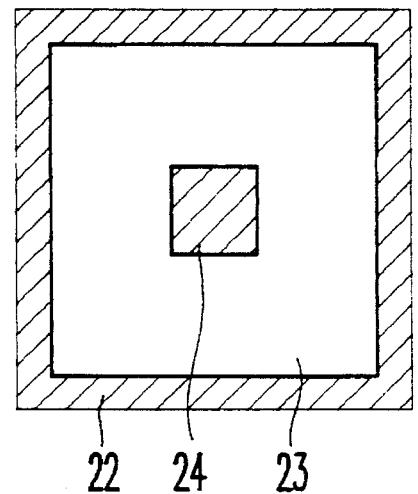
FIG. 3C is a plane view showing a condition of exposure of a wafer by using of a reticle according to the first embodiment of the present invention.

FIG. 3C shows an exposed condition of a portion of the wafer, which is confronted with the main vernier 14A or 14B after completion of the second exposure process using the reticle 20.

A testing wafer(not shown) having a photoresist layer is exposed to light by using of the reticle 20, therefore, the testing wafer is exposed with a shape as same as the shape of the first main vernier 14A of the reticle 20. And then the reticle 20 is moved to direction of X as much as distance X2 between the first main vernier 14A and first sub vernier 15A in FIG. 2, thereafter, the testing wafer is exposed again by using of the reticle 20. A central portion 24 of the exposed portion 23 exposed by the first main vernier 14A is not exposed by the second light shading zone 19 of the first sub vernier 15A.

In the above description, the case that the reticle 20 is moved to direction of X was described, the reticle 20 is also moved to direction of Y. That is, the testing wafer is exposed to light at first by using of the reticle 20, therefore, the testing wafer is exposed with a shape as same as the shape of the second main vernier 14B of the reticle 20. And then the reticle 20 is moved to direction of Y as much as distance Y2 between the second main vernier 14B and second sub vernier 15B in FIG. 2, thereafter, the testing wafer is exposed again by using of the reticle 20. A central portion 24 of the exposed portion 23 exposed by the second main vernier 14B is not exposed by the second light shading zone 19 of the second sub vernier 15B.

As described above, a portion of the testing wafer is exposed repeatedly by the main verniers 14A and 14B and the sub verniers 15A and 15B, a reticle rotation error can be detected by using of condition of exposure(that is, measuring a distance between unexposed portions 22 and 24 of FIG. 3C). A correction value can be obtained by using of a misalignment value, and the correction is performed by correction value. Therefore the alignment is improved.

Figure 4:
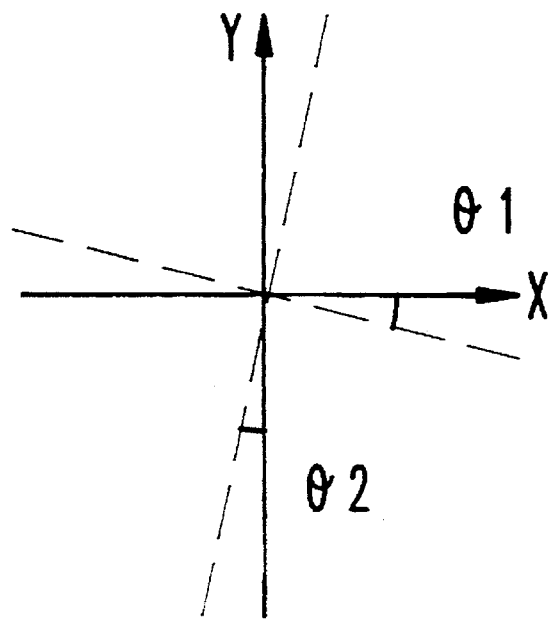
FIG. 4 is a graph depicting a reticle rotation error.

FIG. 4 is a graph depicting a reticle rotation error, solid lines depict ideal exposed portions position by the first and second main verniers 14A and 14B and the first and second sub verniers 15A and 15B, and dotted lines depict exposed position caused by the reticle rotation error. In FIG. 4, θ1 is a misaligned value caused by the first main vernier 14A and first sub vernier 15A when the reticle 20 is moved to direction of X, θ2 is a misaligned value caused by the second main vernier 14B and second sub vernier 15B when the reticle 20 is moved to direction of Y. Since these misaligned values comprise value of lens distortion error, an accurate value of reticle rotation error is obtained as follow;

$$\text{Value of reticle rotation error} = \frac{\theta 1 + \theta 2}{2}.$$

According to the above formula, value of reticle rotation error is calculated, and a misalignment can be adjusted with the value of reticle rotation error, therefore, alignment of a photomask can be improved.

The other embodiment of the present invention will be described.

Figure 5:
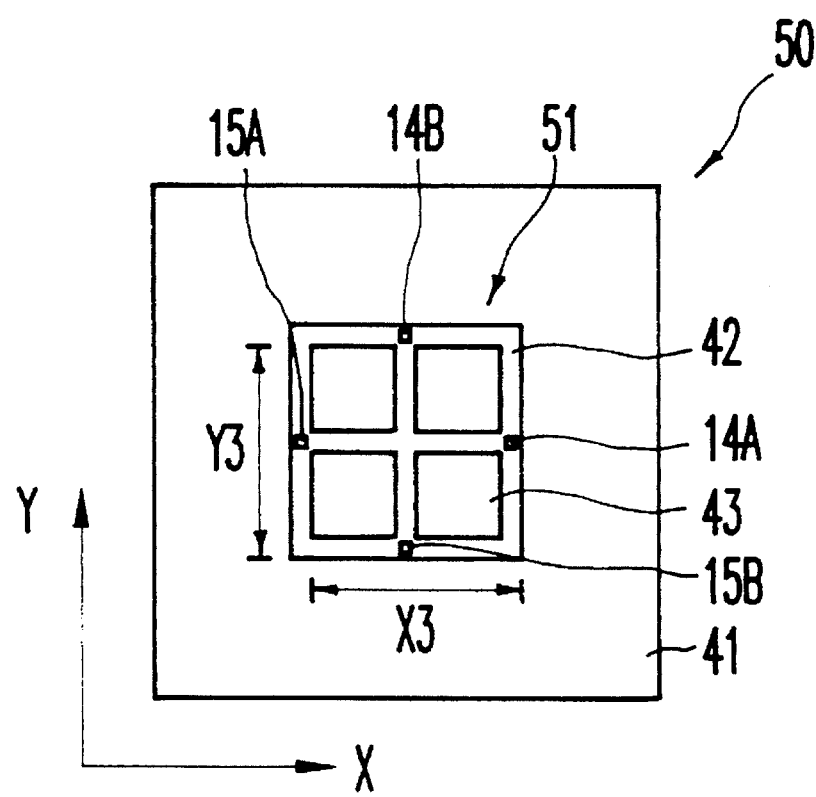
FIG. 5 is a plane view a reticle according to the second embodiment of the present invention.

FIG. 5 is a plane view a reticle according to the second embodiment of the present invention, a reticle 50 is formed of a unit field 51, a pair of main verniers 14A and 14B, a and a pair of sub verniers 15A and 15B. The unit field 51 comprising of a scribe lane zone 42 and a plurality of pattern areas 43 is formed on a quartz substrate 41. The first main vernier 14A is formed on right scribe lane zone, the first sub vernier 15A is formed on left scribe lane zone. The second main vernier 14B is formed on upper scribe lane zone, the second sub vernier 15B is formed on lower scribe lane zone. Each vernier can be formed with chromium by a printing process.

The first and second main verniers 14A and 14B are formed on a horizontal axis passed through a center of the unit field 51, the first and second sub verniers 15A and 15B are formed on a vertical axis passed through a center of the unit field 51.

Figure 1:
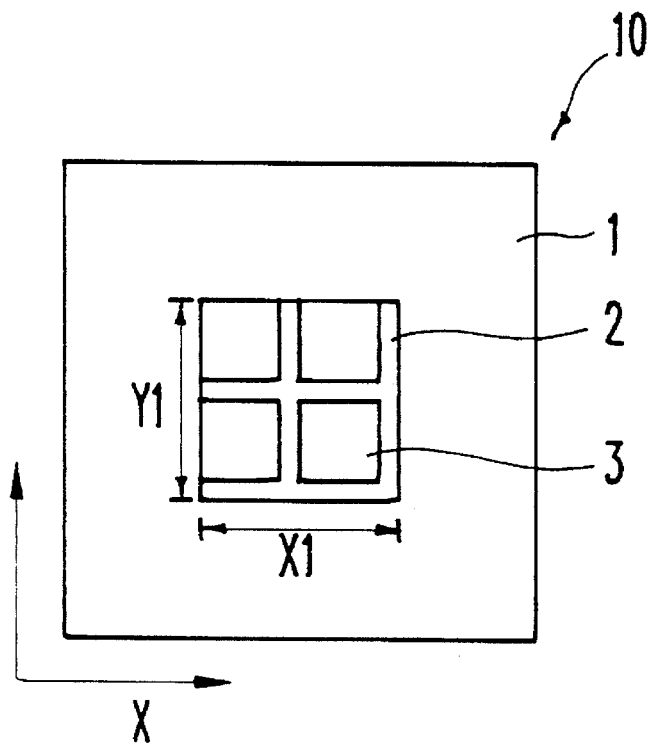
FIG. 1 is a plane view of an ordinary reticle.

Meanwhile, in order to use overlapping of the main vernier and the sub vernier, a unit stepping distance to direction of X of a stepper is set up with a distance X3 between the first main vernier 14A and the first sub vernier 15A, a unit stepping distance to direction of Y of the stepper is set up with a distance Y3 between the second main vernier 14B and the second sub vernier 15B.
(X3 of FIG. 5 is equal to X1 of FIG. 1, Y3 of FIG. 5 is equal to Y1 of FIG. 1)

A shape of each main vernier is the same as that of each sub vernier of the first embodiment as shown in FIG. 3A, a shape of each sub vernier is same as that of each sub vernier of the first embodiment as shown in FIG. 3B. Also, measuring method of reticle rotation error by using of the reticle 50 according to the second embodiment is same as that of the first embodiment.

As described above, the reticle according to the present invention can detect accurately a reticle rotation error, therefore, an alignment can be improve.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A reticle having a unit field which is formed with a scribe lane zone and a plurality of pattern areas comprising;

a first main vernier formed at outer side of right end of said unit field;

a first sub vernier formed at outer side of left end of said unit field;

a second main vernier formed at outer side of upper end of said unit field;

a second sub vernier formed at outer side of lower end of said the unit field.

2. The reticle of claim 1, wherein said first main vernier and said first sub vernier are formed on an horizontal axis passed through a center of said unit field, said second main vernier and second sub vernier are formed on a vertical axis passed through a center of said unit field.

3. The reticle of claim 1, wherein said main vernier and said sub vernier collectively comprise a first light shading zone having a square loop shape and a second light shading zone having a square shape, with said second light shading zone being formed at a central portion of said first light shading zone.

4. The reticle of claim 3, wherein a length of an inner side space of said first light shading zone of said sub vernier is less than that of said first light shading zone of said main vernier.

5. The reticle of claim 3, wherein a length of a side of said second light shading zone of said sub vernier is less than that of said second light shading zone of said main vernier.

6. A reticle having a unit field which is formed with a scribe lane zone and a plurality of pattern areas comprising;

a first, main vernier formed on right scribe lane zone;

a first sub vernier formed on left scribe lane zone;

a second main vernier formed on upper scribe lane zone;

a second sub vernier formed on lower scribe lane zone.

7. The reticle of claim 6, wherein said first main vernier and said first sub vernier are formed on an horizontal axis passed through a center of said unit field, said second main vernier and second sub vernier are formed on a vertical axis passed through a center of said unit field.

8. The reticle of claim 6, wherein said main vernier and said sub vernier collectively comprise a first light shading zone having a square loop shape and a second light shading zone having a square shape, with said second light shading zone being formed at a central portion of said first light shading zone.

9. The reticle of claim 8, wherein a length of an inner side space of said first light shading zone of said sub vernier is less than that of said first light shading zone of said main vernier.

10. The reticle of claim 8, wherein a length of a side of said second light shading zone of said sub vernier is less than that of said second light shading zone of said main vernier.

* * * * *